United States Patent [19]
Van Zanten

[11] Patent Number: 4,564,855
[45] Date of Patent: Jan. 14, 1986

[54] HIGH CURRENT PNP TRANSISTOR FORMING PART OF AN INTEGRATED MONOLITHIC CIRCUIT

[75] Inventor: François Van Zanten, Paris, France

[73] Assignee: Thomson CSF, Paris, France

[21] Appl. No.: 473,672

[22] Filed: Mar. 8, 1983

[30] Foreign Application Priority Data

Mar. 12, 1982 [FR] France ................................ 82 04216

[51] Int. Cl.$^4$ ............................................. H01L 27/04
[52] U.S. Cl. ........................................ 357/46; 357/44; 357/48
[58] Field of Search ............................ 357/44, 46, 48

[56] References Cited

U.S. PATENT DOCUMENTS

| | | | |
|---|---|---|---|
| 3,868,722 | 2/1975 | Le Can | 357/46 |
| 4,054,900 | 10/1977 | Tokumaru et al. | 357/46 |
| 4,110,782 | 8/1978 | Nelson et al. | 357/44 |
| 4,160,988 | 7/1979 | Russell | 357/46 |
| 4,277,794 | 7/1981 | Nuzillat | 357/46 |

FOREIGN PATENT DOCUMENTS

| | | |
|---|---|---|
| 1538402 | 9/1968 | France . |
| 1559607 | 3/1969 | France . |
| 2154786 | 5/1973 | France . |

Primary Examiner—William D. Larkins
Assistant Examiner—John Lamont
Attorney, Agent, or Firm—Cushman, Darby & Cushman

[57] ABSTRACT

A structure associating a high current NPN transistor with a PNP control transistor also able to withstand relatively high currents in an integrated circuit structure. This structure comprises an N$^+$ type substrate overlaid by a P type epitaxied layer and a second N type epitaxied layer. The PNP transistor is disposed in the center of a region defined by two successive peripheral isolating walls. The NPN transistor is disposed in the annular zone. In this zone, the N$^+$ substrate and the N layer are connected together by a buried N$^+$ type layer locally short-circuiting the P type layer along a ring, thus isolating the central part of this layer at the level of the PNP transistor.

4 Claims, 5 Drawing Figures

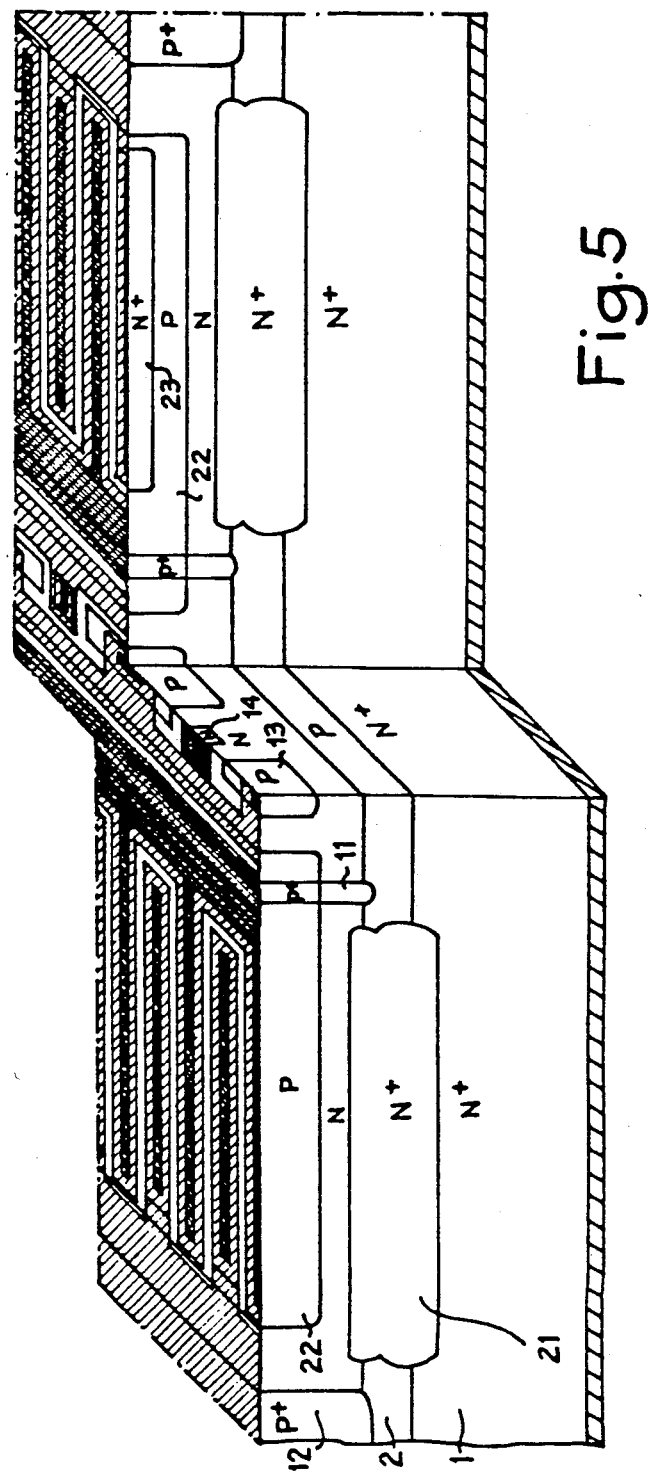

HIGH CURRENT PNP TRANSISTOR FORMING PART OF AN INTEGRATED MONOLITHIC CIRCUIT

BACKGROUND OF THE INVENTION

Different structures have been imagined for forming PNP or NPN transistors able to pass relatively high currents in integrated circuits. The present invention relates more particularly to integrated structures comprising vertical NPN transistors able to pass high currents and aims at providing also in such structures PNP transistors able to pass high currents and adapted, if so desired, to satisfactorily control the vertical NPN transistors.

FIG. 1 shows a particular integrated circuit structure comprising above an N+ type substrate 1 a first P type epitaxied layer 2 and a second weakly doped N type epitaxied layer 3. This structure is relatively unusual for generally integrated circuit wafers comprise a P type substrate carrying an N− type epitaxied layer, that is to say a structure comprising only the equivalent of layers 2 and 3, layer 2 corresponding in this case to a substrate.

In the left-hand and right-hand parts of FIG. 1 isolated by P+ type walls reaching the P type layer 2, conventional and well known NPN and PNP transistors have been shown. The regions comprising these transistors bear no numerical reference; only the types of conductivity of the different layers have been shown and the letters E,B and C have been placed opposite the respective emitter, base and collector metalizations.

The advantage of the structure having two epitaxies of opposite types, illustrated in FIG. 1, resides essentially in the fact that it allows high current vertical NPN transistors to be formed such as shown in the central part of the figure. For these NPN transistors, the lower face of the substrate is metalized and corresponds to the collector. Within the N− type layer 3 is diffused a P type zone 5 corresponding to the base within which is diffused an N type zone 6 corresponding to the emitter. The N− type layer 3 is connected to N+ layer 1 by an N+ buried layer 7. In fact, this layer 7 results from two successive and superposed implantation/diffusions formed respectively in substrate 1 before the epitaxial growth of layer 2, then in layer 2 before the epitaxial growth of layer 3. The advantages of the vertical NPN transistor structure shown appear clearly and reside essentially in the fact that such transistors can pass high currents while presenting low ohmic drops.

Nevertheless, if it is desired to use, in a structure of the kind shown in FIG. 1, a PNP transistor able to pass a high current, for example for controlling a vertical NPN transistor, a conventional lateral structure will have to be used such as shown in the right-hand part of the figure. But, a known defect of lateral PNP transistors formed by conventional technologies resides in their inability to deliver high current intensities (greater than 0.5 mA per element). This leads to multiplying the number of elements, so in taking up a large silicon area.

When too high a current is demanded of a lateral PNP transistor, two principal phenomena occur: on the one hand, the current gain decreases; on the other hand, a high parasite current is diverted towards the negative terminal of the power supply source (the substrate forming a second collector). This diverted current may become considerable (of the same order of size as the useful current) if, in addition, the PNP transistor is in a saturation condition. The result is that the power is taken from the power supply and dissipated in heat in the semi-conductor chip. This power may be high if the circuit is operating at a high voltage.

It may be considered that the PNP transistor is associated with a parasite PNP transistor generally called "substrate PNP transistor" which has the same base as the useful PNP transistor and a collector corresponding to the substrate, that is to say in the case of the structure illustrated in FIG. 1, to layer 2; this parasite transistor has two emitters, one being the emitter and the other the collector of the useful PNP transistor. It is because of this second emitter (the collector of the useful PNP transistor) that the increase of the parasite current is explained in the case of saturation of the useful PNP transistor.

One object of the present invention is to resolve these problems and to provide a PNP transistor structure compatible with the structure shown in FIG. 1 and able to pass high currents without causing parasite currents to appear leading to overheating of the semi-conductor chip.

Another object of the present invention is to provide a particular application of this PNP transistor structure as means for controlling a high current NPN transistor.

SUMMARY OF THE INVENTION

To attain these objects, as well as others, the present invention provides a PNP transistor, in an integrated circuit structure comprising an N+ substrate covered with a first P type layer, itself covered with a second N type layer. This transistor comprises a zone in which emitter and base contact diffusions are formed within the second layer; this zone is surrounded by two successive P type isolating walls passing through the second layer, the internal wall being coated with a collector metalization; a peripheral N+ type buried layer situated between the two walls extends transversely from the N+ substrate to the second N type layer.

This PNP transistor may more especially be used for controlling a vertical NPN transistor of the type described above, the emitter of the PNP transistor being connected to the collector of the NPN transistor, the collector of the PNP transistor to the base of the NPN transistor and the base of the PNP transistor being conected to a control terminal. In this case, the NPN transistor is disposed between the two isolating walls and comprises an N type emitter diffusion inside a P type zone diffused in the second N type layer, a collector metalization being formed on the free surface of the substrate and the external isolating wall being connected to the most negative terminal of the circuit.

BRIEF DESCRIPTION OF THE DRAWINGS

These objects, features and advantages, as well as others, of the present invention will be discussed in greater detail in the following description of preferred embodiments made with reference to the accompanying figures in which:

FIG. 5 is a partial perspective view in section of one embodiment of an integrated circuiit implementing the circuit of FIG. 3 in digited form.

DESCRIPTION OF THE PREFERRED EMBODIMENTS

Generally it will be noted that no scale is respected, neither within the same figure, nor from one figure to another, but that, as is customary in the field of representation of semi-conductors, the dimensions of the different layers have been arbitrarily expanded to facilitate readability. On the other hand, as far as possible, the same references have been kept from one figure to another to designate identical or similar layers and/or elements.

Figure 1:
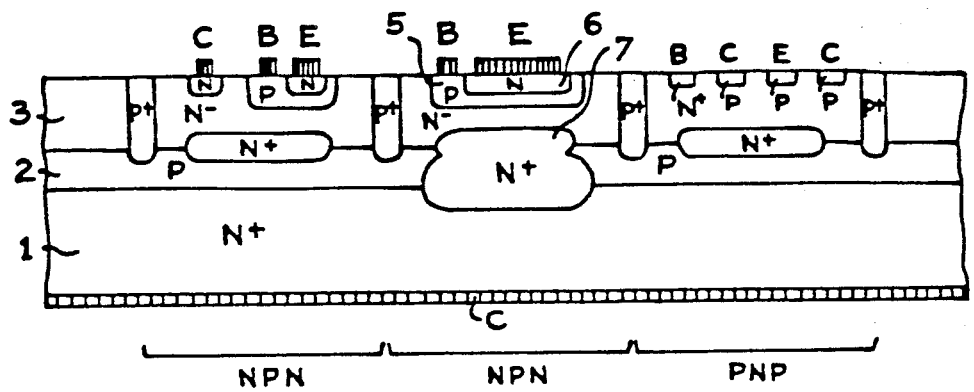
FIG. 1 is a sectional view of an integrated circuit portion for explaining the state of the art.
Figure 2:
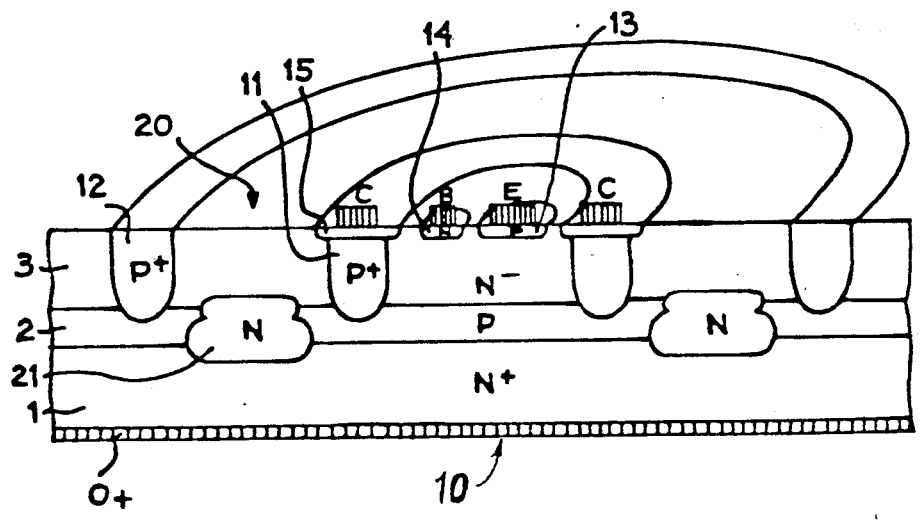
FIG. 2 is a sectional view showing schematically the structure of a PNP transistor in accordance with the present invention.

FIG. 2 shows a PNP transistor in accordance with the present invention. This transistor is formed from a semiconductor structure of the type shown in FIG. 1 comprising successively a $N^+$ substrate 1, a P type layer 2 and an $N^-$ type layer 3. The PNP transistor is formed within a central zone 10 surrounded by two successive isolating walls 11 and 12. These isolating walls which surround the central zone 10 are formed of $P^{30}$ type diffused zones passing through the N type layer 3 to reach the P type layer 2. The PNP transistor of the invention comprises a P type emitter zone 13 formed in the central zone 10 as well as an $N^+$ type base contact connection zone 14. These separate zones 13 and 14 may for example be formed by diffusion or implantation/diffusion. A part at least of zones 13 and 14 are overlaid by a respective emitter and base metalization E and B. The collector contact C of this vertical PNP transistor is taken through the upper surface of the internal isolating wall 11. A diffused P type contact making layer 15 is formed for providing contact with the collector metalization. This contact making layer 15 will possibly be wider than wall 11, presenting more especially an overflow towards central zone 10 for promoting recovery of the minority carriers and thus improving the gain of the transistor. Between the two isolating walls 11 and 12 is located a region 20 which plays essentially an isolating role: a buried N type layer 21 of annular shape situated between the internal and external isolating walls neutralizes and reverses the type of doping of the P layer along a ring. Thus, electric conduction is provided between the upper and lower portions (layer 3 and substrate 1) in the annular zone 20. The result is that the portion of the P type layer 2 situated under the central zone 10 is isolated with respect to the rest of this P type layer 2. Consequently, the collector C of the PNP transistor may be connected to a chosen potential while maintaining layer 2 at a negative potential outside the annular zone defined by layer 21, which is desirable for providing suitable isolation of the other circuit elements. This negative biasing of layer 2 may for example be achieved by metalizing the upper part of the external isolating wall 12 and by connecting it to a negative terminal. Similarly, the buried ring 21 must be at a positive potential. For this, a metalization is deposited on the visible face of substrate 1 and this metalization is connected to a positive potential.

The annular buried layer 21 may be formed in the same way as was described for buried layer 7 in the case of FIG. 1.

Thus, a PNP transistor is provided presenting no possibility of parasite dissipation even when the main current between its emitter and collector increases or when it is in a saturation condition.

Figure 3:
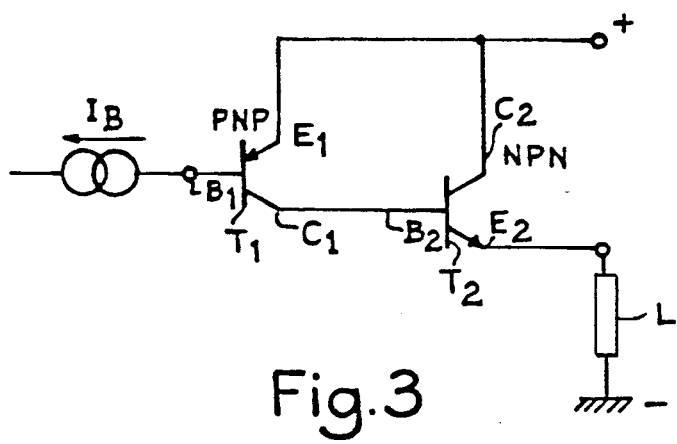
FIG. 3 is an electric circuit diagram.

FIG. 3 shows an electric circuit which is often required in practical applications and which may be formed in a particularly simple way within an integrated circuit by using a PNP transistor of the type described above with reference to FIG. 2. The circuit of FIG. 3 comprises an NPN type transistor T2 controlled by a PNP type transistor T1. The transistors T1 and T2 have emitters, bases and collectors designated respectively by E1, B1, C1 and E2, B2, C2. The base of transistor T2 is connected to the collector of transistor T1, the collector of transistor T2 and the emitter of transistor T1 are connected to a positive power supply terminal, the emitter of transistor T2 is connected to ground or the most negative power supply terminal through a load L and the input terminal of the circuit corresponds to the base B1 of transistor T1 to which is connected in a known way a control current source.

Figure 4:
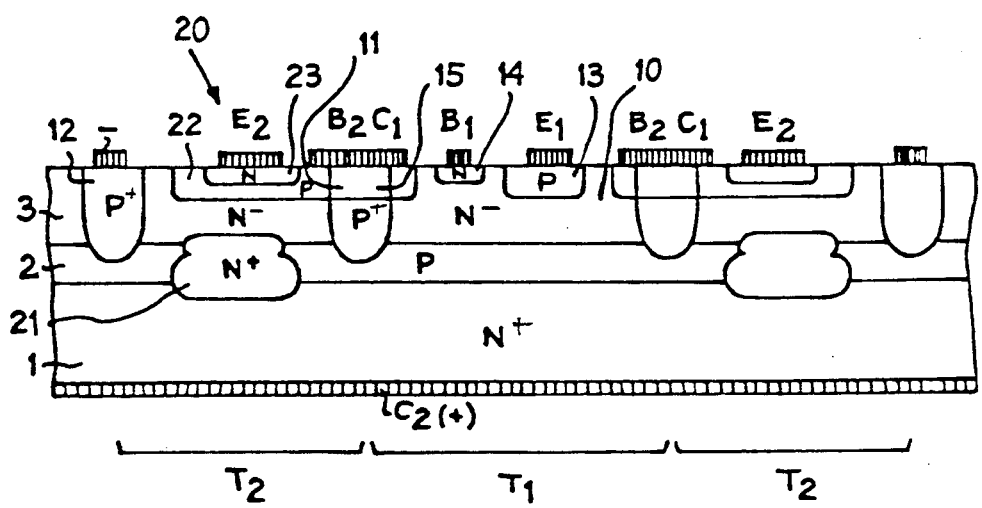
FIG. 4 is a sectional view illustrating schematically one embodiment in integrated circuit form of the circuit of FIG. 3.

FIG. 4 shows very schematically how a structure such as the one shown in FIG. 3 can be integrated in a particularly simple way in the case where the PNP transistor T1 has the structure illustrated in FIG. 2. In this case, the NPN transistor may be disposed in the annular region 20. Thus, to go over from the structure of FIG. 2 to that of FIG. 4, the P type layer 15 has been simply extended outwardly to form in the annular region 20 a base layer 22 inside which is formed an N type emitter diffusion 23. Thus, a vertical NPN transistor is obtained similar to the one shown in the center of FIG. 1 which is situated, in the case of FIG. 4, peripherally with respect to the central PNP transistor T1. The collector metalization $C_2$ of this transistor is situated on the free face of the substrate.

In this case, all the minority carriers injected into the N type epitaxied layer 3 at the base of the PNP transistor are recovered in the base of the NPN transistor for this latter is integral with the P type epitaxied layer 2 corresponding to the collector of transistor T1 through the internal $P^+$ type wall 11. There is then no possibility of a parasite current towards the negative terminal of the supply source.

By way of a variant of the present invention, it will be noted that, in the structures illustrated in FIGS. 2 and 4, a P type dopant, for example boron, could have been implanted, before proceeding with epitaxy 3, in the surface of the epitaxied layer 2 and at the level of the central zone 10, this implanted zone then being caused to diffuse upwardly into the base of the PNP transistor. This reduces the thickness of this base and improves the gain and the transition frequency while reducing the collector resistance of this transistor. This process may more especially be used in the case where the P type isolating walls 11 and 12 are formed by effecting simultaneously downward and upward diffusions, some from the surface of the wafer and the others from the P type zones implanted in the surface of the P type epitaxied layer 2 before formation of the N type epitaxied layer 3.

The advantages of the invention are then in brief:

reduction of the power dissipated in the semiconductor wafer because of the elimination of the currents diverted towards the negative pole of the power supply, provision of a high current gain because of the high gain of the vertical PNP transistor, reduction of the possible phase rotation because of the high value of the transition frequency ($f_T$) of the vertical PNP transistor (this characteristic is important especially if the device is to form part of a feedback loop, for example a regulator), a compact structure using a small silicon area.

FIG. 5 is a perspective view showing one particular embodiment of the present invention in the form of a an interdigitated structure. This figure is shown in a way which corresponds substantially to practical reality, but it will be readily understood that it is only partial and that the isolating wall 11 completely surrounds the central zone whereas isolating wall 12 surrounds completely the whole of the structure. In this figure, the same references are used as in FIG. 4. The limits of the contact zones between metalization and semi-conductor are shown with broken lines. The metalizations are hatched and the zones where the metalizations make contact with an underlying semi-conductor layer are crosshatched. This figure will not be described in greater detail for it is self explanatory and the description thereof corresponds to that of FIG. 4. Nevertheless, it will be considered that this figure forms an integral part of the present description and some of its features may be taken up in the following claims.

The present invention is not limited to the previously described embodiments; it encompasses on the contrary the different variations and generalizations included within the scope of the following claims, more particularly all the types of conductivity may be reversed.

What is claimed is:

1. A semiconductor structure comprising:
    (a) an N+ substrate;
    (b) a P layer covering said N+ substrate;
    (c) an N− layer covering said P layer;
    (d) means for defining a central zone and an annular zone, said defining means including non-intersecting innermost and outermost P+ isolating walls passing through said N− layer and at least partially penetrating into said P layer, said central zone being bounded by said innermost P+ isolating wall, said annular zone being disposed between said innermost and outermost P+ isolating walls;
    (e) a PNP transistor being disposed in said central zone and having:
        (i) a P emitter zone formed in said central zone,
        (ii) an N+ base zone formed in said central zone, and
        (iii) said innermost P+ isolating wall providing a collector for said PNP transistor
    (f) an NPN transistor controlled by said PNP transistor, disposed in said annular zone and including:
        (i) a P base zone contacting said innermost P+ isolating wall,
        (ii) an N emitter zone disposed on a portion of said P base zone, and
        (iii) an N+ connecting zone contacting both said N+ substrate and said N− layer, said N+ connecting zone and said N+ substrate providing a collector for said NPN transistor, said N+ connecting zone being annular in structure to cause a central portion of said P layer to be isolated from portions of said P layer outside said annular N+ connecting zone.

2. A semiconductor structure according to claim 1 wherein said P base zone and said N emitter zone are in interdigitated form.

3. A semiconductor structure according to claim 1 wherein said PNP transistor further includes an overlapping zone contacting and extending from said innermost isolating wall into said central zone.

4. A semiconductor structure according to claim 1, wherein a boundary exists between said P layer and said N-layer, and wherein said PNP transistor further includes a buried P layer in said central zone at said boundary, said buried P layer extending into said N− layer and reducing its thickness.

* * * * *